Oct. 4, 1966 D. R. SULLIVAN 3,277,381

PULSE DELAY MULTIPLIER

Filed March 29, 1963

INVENTOR.
DEAN R. SULLIVAN

BY

ATTORNEYS

United States Patent Office 3,277,381
Patented Oct. 4, 1966

3,277,381
PULSE DELAY MULTIPLIER

Dean R. Sullivan, San Diego, Calif., assignor to the United States of America as represented by the Secretary of the Navy Filed Mar. 29, 1963, Ser. No. 269,218
1 Claim. (Cl. 328—56)

The invention described herein may be manufactured and used by or for the Government of the United States of America for governmental purposes without the payment of any royalties thereon or therefor.

The present invention relates to a pulse delay multiplier, and more particularly to a pulse delay multiplier for multiplying the delay of a passive delay unit, utilizing digital techniques.

The prior art techniques for introducing delays to pulses of relatively long time periods have been beset with many problems. Utilizing a passive delay unit of several hundred microseconds runs into high cost, weight, and space requirements which make them impractical for many applications. A further disadvantage of a purely passive delay unit for achieving long delay periods lies in the attenuation present, i.e., assertion loss within the delay line. To obviate this loss several driver amplifiers are required which again increase overall cost, size and weight requirements. The electronic delay circuits such as a ramp function delay unit are inadequate in many applications due to the limited accuracy available in inherent jitter associated with longer delays. The delay time is also severely affected by temperature and component variations, requiring frequent measurements and readjustments. Prior art attempts to utilize digital techniques in creating pulse delay times in the several hundred microsecond order have been successful but again have become relatively expensive and space consuming.

According to the invention, the delay of a passive delay line is multiplied through the use of simple reliable digital techniques. The output of the delay line is coupled back to the input through an inhibit circuit causing the input pulse to be recirculated in the delay line. At the same time the output of the delay line is also coupled to a pulse frequency dividing network which after a predetermined number of pulse recirculations through the delay line, i.e., input pulses to the dividing network, yields an inhibit pulse which stops the recirculation of the original pulse through the delay line. The output of the delay line is also ANDED with the inhibit pulse which yields an output one pulse later, i.e., one delay time later, and resets the dividing means. Hence, an output pulse is yielded at a delayed time from the input pulse to the system a discrete number of the inherent delay times of the delay line utilized. Since binary techniques are employed, accuracy is not affected by component variations or ambient temperature variations and the utilization of a very minimum number of components results in a saving of cost and space.

It is thus an object of the present invention to provide a pulse delay multiplier which is capable of multiplying the delay time of any passive delaying means.

Another object is the provision of a pulse delay multiplier utilizing digital techniques throughout.

A further object of the invention is to provide a pulse delay multiplier which is simple yet extremely accurate.

Still another object is the provision of a pulse delay multiplier which is relatively inexpensive and compact.

Yet another object of the invention is to provide a pulse delay multiplier which requires a minimum of maintenance and adjustment.

Other objects and many of the attendant advantages of this invention will be readily appreciated as the same becomes better understood by reference to the following detailed description when considered in connection with the accompanying drawings in which like reference numerals designate like parts throughout the figures thereof and wherein.

Figure 1:
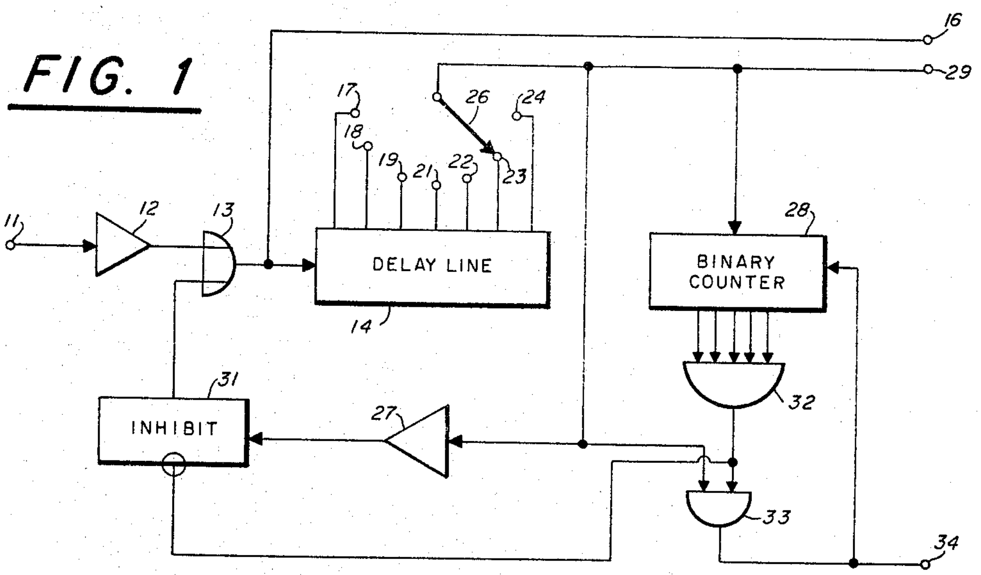
FIG. 1 is a block diagram of a preferred embodiment of the present invention.

Referring to FIG. 1, input terminal 11 is connected to the input of amplifier 12, the output of which is connected to one input of OR gate 13. The output of OR gate 13 is connected to the input of delay line 14 and to terminal 16. Delay line 14 has taps 17 through 24 which are connected to the contacts of switch 26. Switch 26 is connected to the input of amplifier 27 and binary counter 28 and terminal 29. The output of amplifier 27 is connected to one input of inhibit gate 31, the output of which is connected to a second input of OR gate 13. The outputs of binary counter 28 are connected to the inputs of AND gate 32, the output of which is connected to one input of AND gate 33 and the inhibit input of inhibit gate 31. The other input of AND gate 33 is connected to terminal 29. The output of AND gate 33 is connected to terminal 34 and to the reset input of binary counter 28.

Binary counter 28 and AND gates 32 and 33 comprise a dividing means which can be of the type described in my co-pending application entitled "Odd and Even Integer Counter," Serial No. 260,926, filed Feb. 25, 1963. It functions generally as follows: After a predetermined number of input pulses the outputs to AND gate 32 are in coincidence and AND gate 32 yields a gate pulse output which is continuous until one or more of its inputs are negated. The next pulse coming in will then yield an output from AND gate 33 which is the output pulse of the unit, and at the same time, reset binary counter 28, removing the gate at the output of AND gate 32.

Figure 2:
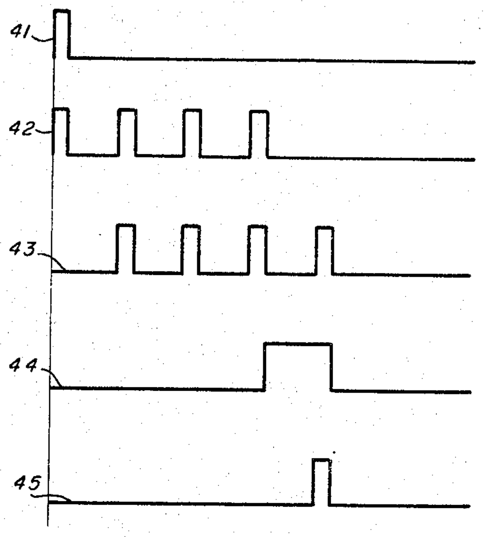
FIG. 2 is a graphic representation of waveforms found throughout various portions of FIG. 1.

With reference now to both FIGS. 1 and 2, the operation of the entire system will be described. An incoming pulse shown as waveform 41 is applied to terminal 11 which is amplified in amplifier 12 and passed through OR gate 13 to delay line 14. Switch arm 26 selects the increment of delay that it is desired to multiply, and after this increment of delay, the pulse is applied through switch 26 to the input of amplifier 27. Amplifier 27 amplifies the pulse to overcome any attenuation or insertion loss in delay line 14, and applies this amplified pulse to the input of inhibit gate 31. Since there is no inhibit input at this point, inhibit gate 31 passes this pulse back through OR gate 13 to the input of delay line 14, and the pulse continues to circulate until there is an input to inhibit inhibit gate 31. Thus, the input of delay line 14 sees a train of pulses separated by the increment of delay chosen by switch 26 through delay line 14. This train of pulses is shown as waveform 42 and appears at output terminal 16.

At the output of delay line 14, i.e., switch arm 26 and terminal 29, there appears the same train of pulses but delayed by the increment of delay selected by switch 26. This train of pulses is shown as waveform 43.

The delayed train of pulses 43 is also applied to the input of binary counter 28, the operation of which is described more fully in my co-pending application, supra, Binary counter 28 then counts the incoming pulses, i.e., the output of delay line 14, and when a preselected number of pulses are counted, AND gate 32 yields an output gate waveform shown as waveform 44. This gate continues until binary counter 28 is reset. Hence, this gate is applied to inhibit inhibit gate 31 and stop the recirculation of pulses through delay line 14. Thus, the fourth pulse, if binary counter 28 is set on 4, does not recirculate, and since it is also applied to AND gate 33 along with the output of AND gate 32, an output then appears at output pulse (shown as waveform 45) terminal 34, which is also utilized to reset binary counter 28, removing the inhibit input from inhibit gate 31, and the system is ready to accept the next pulse to be delayed at input terminal 11. It is noted as a feature of the present invention that outputs are provided as follows: A train of pulses starting in coincidence with the input pulse and having a period set by delay line 14 (shown as waveform 42); a train of pulses in which the first pulse is delayed by an increment of time set by delay line 14 and subsequent pulses are spaced by the same increment (shown as waveform 43); and a single output pulse having a total delay of an increment of time set by delay line 14 and switch 26 multiplied by the multiplier set in binary counter 28. These outputs are then taken at output terminals 16, 29 and 34, respectively.

It should be understood, of course, that the foregoing disclosure relates to only a preferred embodiment of the invention and that it is intended to cover all changes and modifications of the examples of the invention herein chosen for the purposes of the disclosure which do not constitute departures from the spirit and scope of the invention.

Obviously many modifications and variations of the present invention are possible in the light of the above teachings. It is therefore to be understood that within the scope of the appended claim the invention may be practiced otherwise than as specifically described.

What is claimed is:

A pulse delay multiplier comprising;

a passive delay line having an input adapted for connection to a signal of interest and a plurality of spaced electrical taps for generating different periods of delay, and an adjustable switch for selectively contacting said taps, inhibiting means, said inhibiting means having a signal input, a signal output, and an inhibit input said signal input connected to said switch of the passive delay line, said signal output connected to said delay line input to recirculate signal pulses, a multiple stage binary counter having an input and a plurality of outputs, and binary counter operable to generate a unique binary coded number on said outputs upon each input pulse, said binary counter input being connected to said switch of said delay line, a first AND gate, said AND gate having a plurality of inputs and an output, said plurality of inputs being connected to said plurality of binary counter outputs, said output being connected to said inhibiting means inhibit input, a second AND gate, said second AND gate having first and second inputs and an output, said first input being connected to said switch, said second input being connected to the output of said first AND gate, the last mentioned output being connected to a utilization output circuit and to said binary counter to reset said counter after the generation of any predetermined binary coded number.

References Cited by the Examiner

UNITED STATES PATENTS

| | | | |
|---|---|---|---|
| 1,641,432 | 9/1927 | Hubbard | 333—29 |
| 2,745,004 | 5/1956 | Yeo Pay Yu | 250—27 |
| 3,028,089 | 4/1962 | Ringwalt | 235—164 |

MALCOLM A. MORRISON, *Primary Examiner.*

ROBERT C. BAILEY, *Examiner.*

T. M. ZIMMER, K. MILDE, *Assistant Examiners.*